United States Patent [19]
Liaw et al.

[11] Patent Number: 5,926,706
[45] Date of Patent: Jul. 20, 1999

[54] METHOD FOR MAKING A TRENCH-FREE BURIED CONTACT WITH LOW RESISTANCE ON SEMICONDUCTOR INTEGRATED CIRCUITS

[75] Inventors: Jhon-Jhy Liaw, Taipei; Jin-Yuan Lee, Hsin-Chu, both of Taiwan

[73] Assignee: Taiwan Semiconductor Manufacturing Company, Ltd., Hsin-Chu, Taiwan

[21] Appl. No.: 08/835,578

[22] Filed: Apr. 9, 1997

[51] Int. Cl.$^6$ .............................................. H01L 21/8244
[52] U.S. Cl. .......................... 438/238; 438/525; 438/586
[58] Field of Search .................................. 438/238, 382, 438/384, 385, 525, 586, 659

[56] References Cited

U.S. PATENT DOCUMENTS

| | | | |
|---|---|---|---|
| 5,177,030 | 1/1993 | Lee et al. | 438/525 |
| 5,240,874 | 8/1993 | Roberts | 438/238 |
| 5,292,676 | 3/1994 | Manning | 437/46 |
| 5,378,641 | 1/1995 | Cheffings | 438/525 |
| 5,543,350 | 8/1996 | Chi et al. | 438/238 |
| 5,550,085 | 8/1996 | Liu | 437/203 |

*Primary Examiner*—Chandra Chaudhari
*Attorney, Agent, or Firm*—George O. Saile; Stephen B. Ackerman

[57] ABSTRACT

A method is achieved for forming buried contacts with diffused contact regions on semiconductor integrated circuits having low sheet resistance between the buried contacts and the field effect transistors. The method also allows for greater misalignment tolerances that prevent trenching or electrical opens from occurring in the diffused contact regions when etching the polycide interconnecting lines over the contacts. The method utilizes the etch back of an opening in the photoresist contact mask and a subsequent angular implant to extend the diffused contact regions to reduce the sheet resistance between the buried contacts and the FETs. The method is especially useful for electrically connecting the drain of the pass transistor to the gate of the pull-down transistor on static RAM devices.

23 Claims, 7 Drawing Sheets

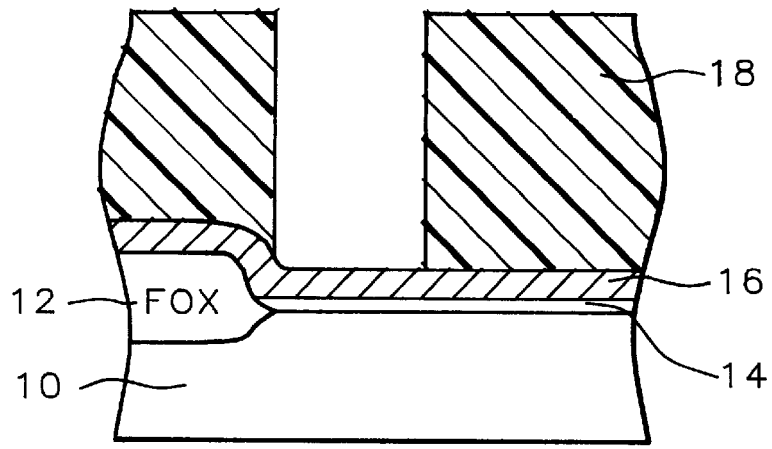
FIG. 1 - Prior Art
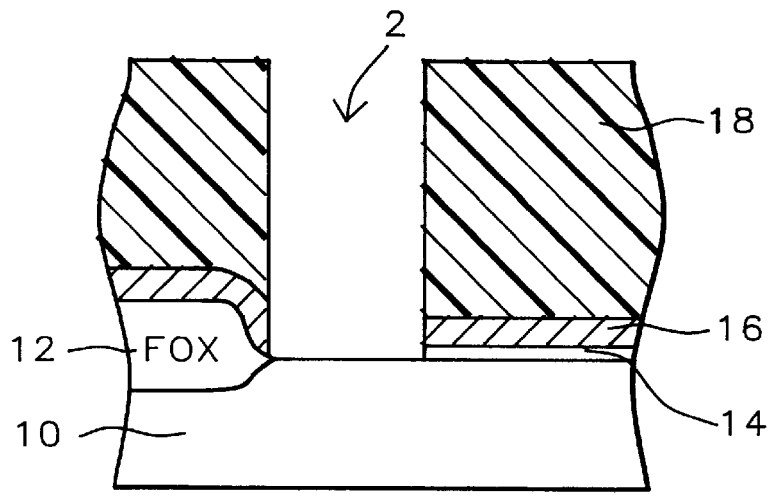
FIG. 2 - Prior Art
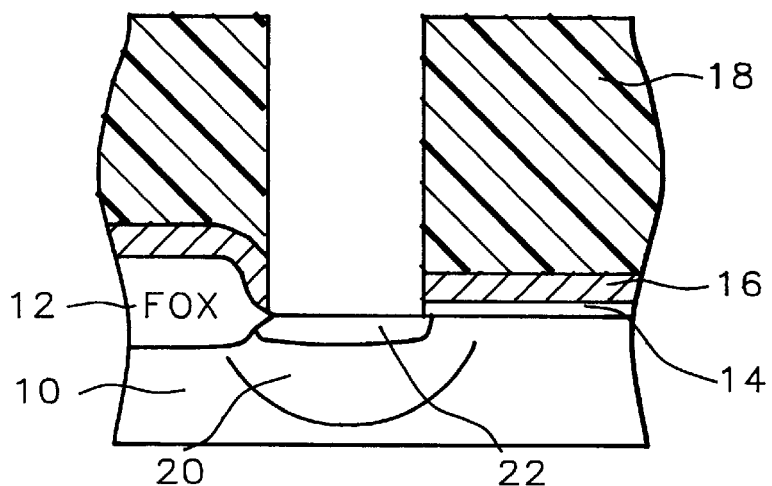
FIG. 3 - Prior Art

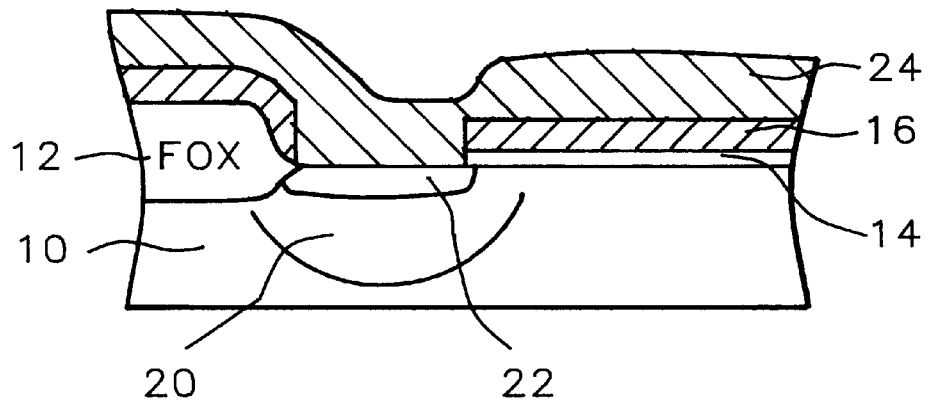
FIG. 4 – Prior Art
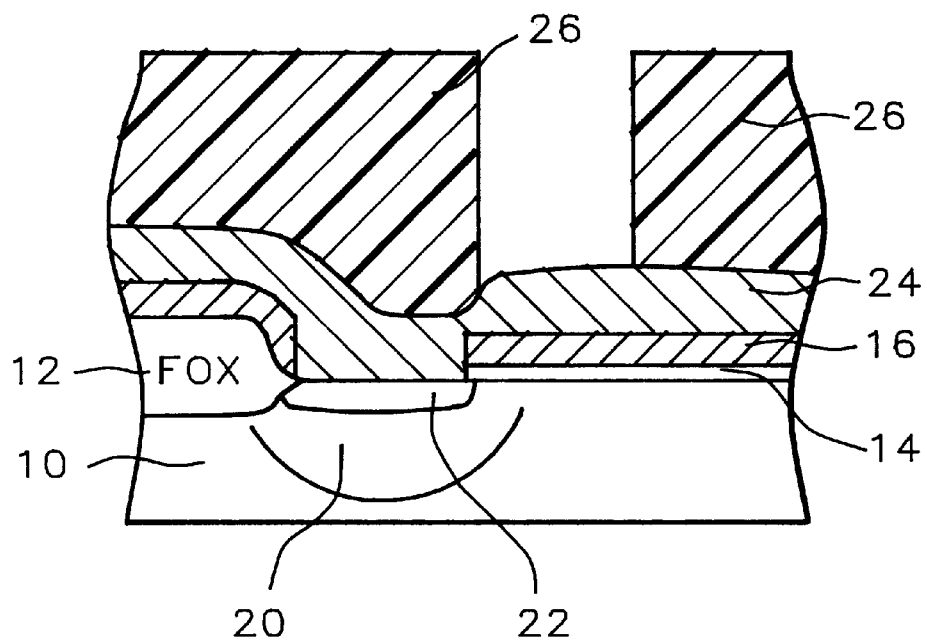
FIG. 5A – Prior Art

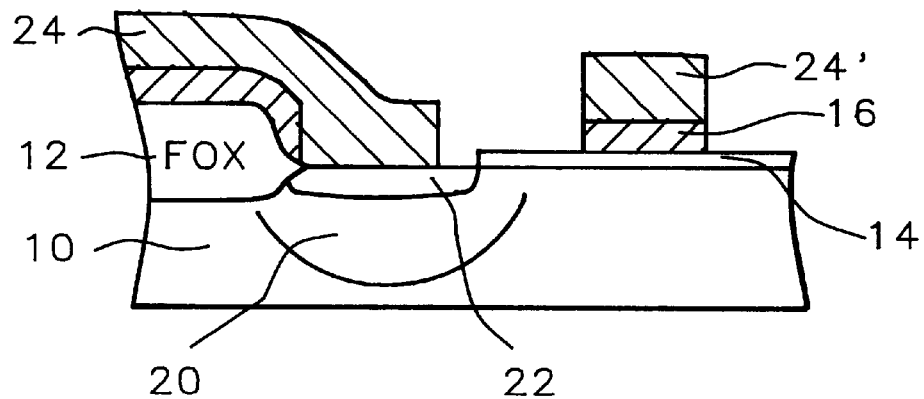
FIG. 5B – Prior Art
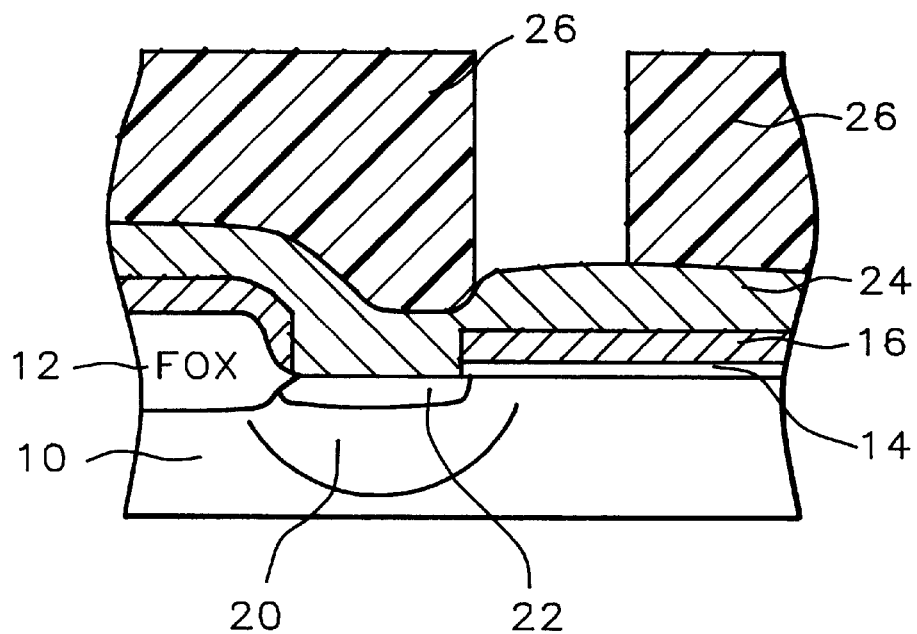
FIG. 6A – Prior Art

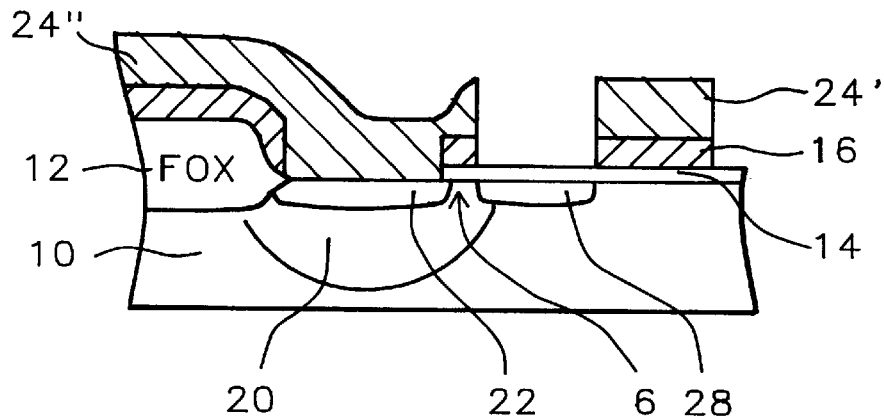
FIG. 6B – Prior Art
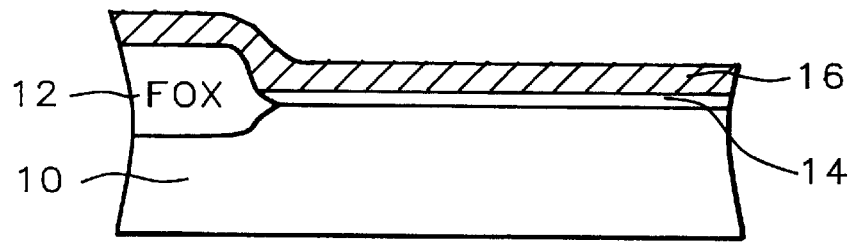
FIG. 7
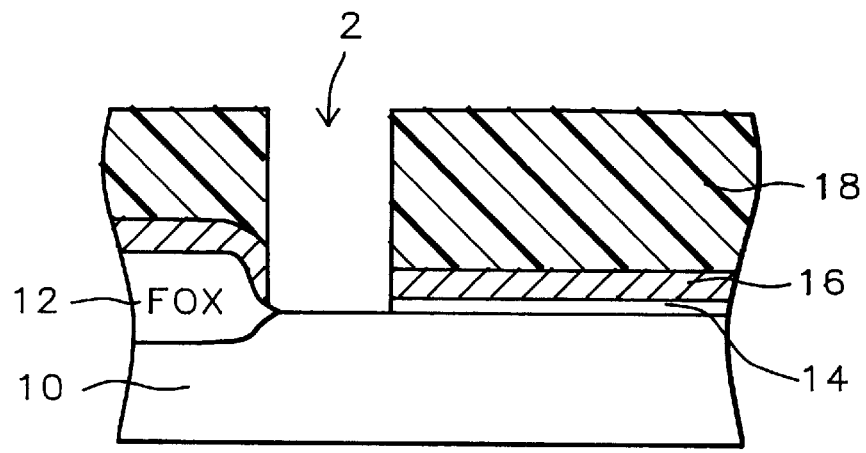
FIG. 8

5,926,706

METHOD FOR MAKING A TRENCH-FREE BURIED CONTACT WITH LOW RESISTANCE ON SEMICONDUCTOR INTEGRATED CIRCUITS

BACKGROUND OF THE INVENTION (1) Field of the Invention

The present invention relates to integrated circuits on semiconductor substrates, and more particularly to a method for making reliable buried contacts to semiconductor devices without trenches, and further having low sheet resistance between the buried contacts and the semiconductor devices. This is particularly applicable to static random access memory (SRAM) for reducing the design rules for achieving high-density memories with better circuit performance.

(2) Description of the Prior Art

Buried contacts between patterned polysilicon layers and the substrate are used extensively in the semiconductor industry to provide electrical connections, and therefore eliminate the need to form metal links to form the contacts. Buried contacts provide an additional level of local interconnections, thereby freeing up the metal levels for providing global interconnections.

The method of making conventional buried contacts and the problems associated with making these contacts are best understood with reference to FIGS. 1 through 6B of the prior art. FIG. 1 shows a portion of a semiconductor substrate 10 on and in which is formed a field oxide (FOX) 12, surrounding and electrically isolating active device areas. A buried contact and FET are formed next by forming a gate oxide 14 and by depositing a thin polysilicon layer 16. A first photoresist mask 18 is patterned to form the opening for the buried contact. The thin polysilicon layer 16 and gate oxide 14 are etched to form the opening 2, as shown in FIG. 2. A boron ($B^{11}$) implant 20 forms an anti-punchthrough (APT) region, and then an $N^+$ implant, such as phosphorus ($p^{31}$), is used to form a buried contact area 22 in the substrate 10, as shown in FIG. 3.

Now as shown in FIG. 4, an $N^+$ doped second polysilicon/silicide (polycide) layer 24 is deposited over the buried contact areas 22 and over the gate oxide 14 in the active device areas. A patterned second photoresist mask 26, as shown in FIG. 5A, is used to pattern the polycide layer 24 to form the FET gate electrode 24' and concurrently the interconnection 24" to the buried contact 22, as shown in FIG. 5B. If the photoresist pattern is misaligned to the left over the buried contact 22, then the etching of layer 24 can result in an undesirable trench 4 in the substrate, as shown in FIG. 5B. This trench can result in excessive leakage current between the buried contact and the substrate, and/or cause an electrical open between the buried contact 22 and the source/drain contact of the FET having the gate electrode 24' which degrades circuit performance. Now as shown in FIG. 6A, if the second photoresist mask is misaligned to the right, then the source/drain implant 28 for the FET that is done later can be prevented from contacting the buried contact 22 resulting (FIG. 6B) in an undoped (open) area 6 causing high resistance and device degradation, as shown in FIG. 6B.

Several methods have been reported to improve the buried contact structure. One method of forming damage-free buried contacts in the semiconductor substrate without trenches and pitted areas is described by Liu, U.S. Pat. No. 5,550,085, in which a titanium nitride (TiN) or titanium tungsten (TiW) material is deposited over the buried contacts, and then a polysilicon layer is deposited and patterned using the TiN or TiW as an etch-stop layer when etching the polysilicon layer, thereby avoiding trenching. However, Liu's method requires an additional critical etch step to remove the TiN or TiW layer.

Another method for forming self-aligned low-resistance buried contacts is described by Manning, U.S. Pat. No. 5,292,676, in which the patterned photoresist mask used to etch the buried contact openings is de-scummed or cut back to expose a thin first polysilicon layer with a gate oxide thereunder at the periphery of the buried contact openings. Manning then implants the buried contacts, which also are implanted through the peripheral gate oxide areas. This allows the buried contacts with lower resistance to be made to remote $N^+$ source or drain structures, thereby minimizing the possibility of forming parasitic MOS devices.

Therefore, there is still a strong need in the semiconductor industry to further improve the buried contacts that are both free of trenches and that also provide low resistance between the buried contacts and the source or drain areas of FETs, while allowing tighter ground rule tolerances for making higher density integrated circuits.

SUMMARY OF THE INVENTION

It is therefore an object of the present invention to provide a method of fabricating improved buried contacts which are trench-free during the polycide gate etch.

Another object of this invention is to provide a low sheet resistance between the buried contacts and the source or drain areas of FETs, and more specifically for the buried contact interconnections between the drain of a pass transistor and the pull-down transistors on static random access memory (SRAM) cells.

It is still another object of the invention to utilize an angular implant to make the diffused contact regions in the substrate for the buried contacts to achieve all of these improvements, and at the same time provide a very manufacturable and cost-effective process.

The method of forming trench-free buried contacts having low sheet resistance between the buried contacts and FET source/drain areas, in accordance with the objects of this invention, is achieved. The method also allows for greater latitude in misaligning the patterned polycide layer to the buried contacts. The method begins by providing a P-(boron) doped single-crystal semiconductor substrate having device areas on the substrate surface that are electrically isolated from each other by Field OXide (FOX) areas, such as by the method of LOCal Oxidation of Silicon (LOCOS), which is commonly used in the industry. A gate oxide for the FETs is grown on the device areas by thermal oxidation or by alternate means. An in-situ $N^+$ doped relatively thin first polysilicon layer is deposited on the gate oxide and over the field oxide regions to protect the gate oxide. A patterned first photoresist mask is used to etch openings for the buried contacts that are then etched in the first polysilicon layer and in the gate oxide to the substrate over the device areas. The patterned first photoresist mask is then recessed over the openings by isotropic etching to expose peripheral portions of the first polysilicon layer self-aligned to the edges of the openings for the buried contacts. A first angular implant using an $N^+$ ion implantation is carried out to form the diffused contact regions in the substrate. The implant is carried out at an angle (about 30°) in the openings, and through the exposed portions of the first polysilicon layer and the gate oxide into the substrate. The implant at this large angle further extends the diffused contact regions in the substrate under the edge of the photoresist mask. Next, a second ion implantation using a P type dopant such as $B^{11}$ is performed to provide an anti-punchthrough implant region in the openings underneath the $N^+$ diffused regions. An $N^+$ doped second polysilicon layer and a silicide layer are deposited consecutively to form a polycide layer over the device areas and in the openings to make electrical contact to the $N^+$ diffused regions in the substrate. A second photoresist mask is used to pattern the polycide layer and the first polysilicon layer to form gate electrodes for the FETs in the device areas, and concurrently to form the local electrical interconnections to the diffused contact regions, and thereby complete the buried contacts. Lightly $N^+$ doped source/drain areas are implanted adjacent to the gate electrodes, a sidewall insulating layer is deposited and etched back to form sidewall spacers on the gate electrodes. Heavily $N^+$ doped FET source/drain contact areas are then implanted adjacent to the sidewall spacers, and are contiguous with the diffused contact regions of the buried contacts as a result of the implant angle of the first implant. This provides a lower sheet resistance between the buried contacts and the source or drain contact areas of the FET. Since the angular implant also results in the diffused contact regions extending further under the gate oxide, there is a greater latitude in misaligning the second photoresist mask that is used to etch the patterned polycide layer contacting the buried contacts. This larger margin of misalignment of the patterned polycide layer prevents trenching in the substrate at the buried contact openings.

This method of making buried contacts is particularly useful for connecting the drain of the pass transistor (FET) to the gate of the pull-down transistor in high-density SRAM cells.

BRIEF DESCRIPTION OF THE DRAWINGS

The objects and other advantages of the invention will become more apparent in the preferred embodiment when read in conjunction with the following drawings, wherein:

FIGS. 1 through 6B are schematic cross-sectional views of a buried contact to an FET by the prior art showing the undesirable occurrence of trenching or electrical openings.

FIGS. 7 through 14 are schematic cross-sectional views of a buried contact to an FET by the method of the present invention for making improved buried contacts having low sheet resistance to the FET and with more latitude in patterning the polycide interconnecting lines over the diffused contact regions of the buried contacts.

DESCRIPTION OF THE PREFERRED EMBODIMENT

Figure 9:
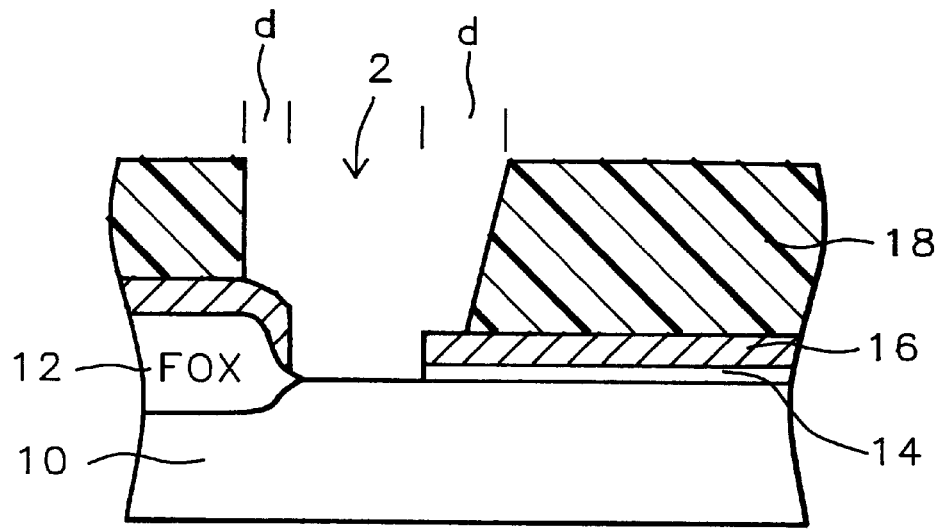

The present invention describes an improved method for fabricating buried contacts, which is particularly useful for electrically interconnecting the drain of the pass transistor (FET) to the gate of the pull-down transistor on an array of static random access memory (SRAM) cells. However, it should be obvious to one skilled in the art that these improved buried contacts can also be used on other integrated circuits where buried contacts having low sheet resistance and free of trenching are desired. Although the method is described for $N^+$ buried contacts and N-channel FETS, the method is equally applicable to P-channel FETs and can be applied to CMOS circuits having both types of devices.

Referring now to FIG. 7, a schematic cross-sectional view is shown of a portion of a substrate 10 on which a low-sheet-resistance, trench-free $N^+$ buried contact to the source or drain of an N-channel FET is made. Only one buried contact and one FET are depicted, but it should be well understood that a multitude of similar structures are formed concurrently on the substrate. The substrate is preferably composed of a P- (boron) doped single-crystal silicon having device areas on the substrate surface and are electrically isolated from each other by Field OXide (FOX) regions 12. One method of forming the FOX is by the LOCal Oxidation of Silicon (LOCOS) method that is commonly used in the semiconductor industry. The FOX is typically grown to a thickness of between about 3000 and 6000 Angstroms. A gate oxide 14 for the FET is then formed on the device areas of the substrate 10, preferably by subjecting the substrate to a thermal oxidation in an oxygen ambient. The gate oxide is typically between about 50 and 200 Angstroms thick. A relatively thin in-situ doped $N^+$ first polysilicon layer 16 is deposited on the gate oxide 14 and over the field oxide regions 12 to protect the gate oxide from contamination during the formation of the buried contacts. The polysilicon layer 16 is deposited using low pressure chemical deposition (LPCVD), using silane ($SiH_4$) as the reactant gas and phosphine ($PH_3$) or arsine ($AsH_3$) as the dopant gas. Layer 16 is preferably deposited to a thickness of between about 300 and 1000 Angstroms, and more particularly to a thickness of about 550 Angstroms. This forms the first layer of what is commonly referred to in the industry as the split-poly process.

Referring now to FIG. 8, conventional photolithographic techniques are used to form a patterned first photoresist layer 18, which is used to form openings 2 in the first polysilicon layer 16 and the gate oxide 14 where the buried contacts are desired. An anisotropic plasma etch using a high-density plasma etcher and an etchant gas mixture having chlorine ($Cl_2$) is used to etch the polysilicon layer 16, and then the gate oxide 14 is removed using plasma etching and an etchant gas such as carbon tetrafluoride ($CF_4$), trifluoromethane ($CHF_3$), and a carrier gas such as argon (Ar) or helium (He).

Referring now to FIG. 9, with the photoresist mask 18 used to form the opening 2 still in place, the sidewalls of the photoresist are isotropically etched to recess the photoresist mask a distance d, and thereby exposing peripheral portions of the first polysilicon layer 16 self-aligned to the edges of the openings 2 for the buried contacts. Preferably the recess is formed by plasma etching in oxygen ($O_2$), and is recessed to a distance d of between about 500 and 2000 Angstroms.

Figure 10:
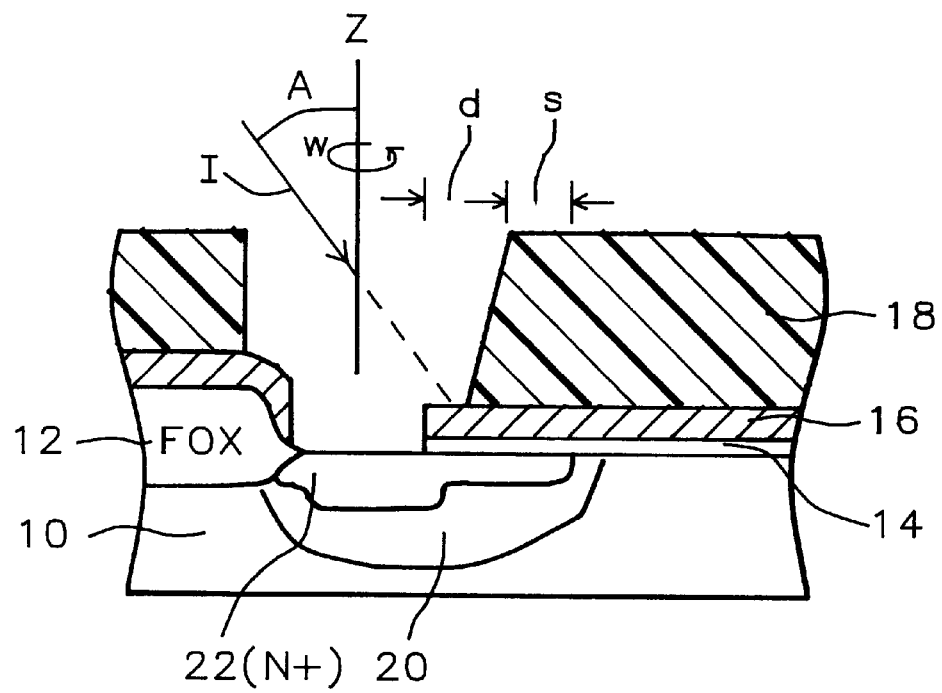

Referring next to FIG. 10, an $N^+$ ion implantation is performed using an angular implant to form diffused contact region 22. The direction of the implant I is carried out at an angle A with respect to the normal axis Z of the substrate, as shown in FIG. 10. This is achieved by tilting the chuck, on which the substrate is clamped, by an angle A with respect to the implant direction I in the implanter. The chuck is then rotated at a sufficiently angular speed w (degrees/second) to ensure the uniform doping around the edge of the opening 2 in the substrate 10 under the photoresist mask 18. Preferably the implant is carried out at an angle A of between about 15 and 45 degrees, and more specifically at an angle of about 30 degrees. The implant at this large angle (30°) further extends the diffused contact regions in the substrate under the edge of the photoresist mask 18 a distance s of between about 0.03 and 0.1 $\mu$m using a preferred phosphorus ($p^{31}$) implant dose of between about 1.0 E 15 and 4.0 E 15 atoms/$cm^2$ and at an implant energy of between about 25 and 80 KeV. As will be seen later, this provides increased latitude in misalignment when patterning the polycide layer over the opening 2 to form a contact to the diffused contact region 22 of the buried contact.

Next a second ion implantation using a P type dopant, such as boron ions ($B^{11}$), is performed to provide a buried contact anti-punchthrough (BC-APT) implant region 20 in the opening 2 underneath the $N^+$ diffused region 22. Preferably the dose of the APT implant is between about 1.0 E 13 and 7.0 E 13 atoms/cm$^3$ and the implant energy is between about 60 and 120 KeV. The remaining first photoresist mask 18 is then stripped, for example by plasma ashing in $O_2$.

Figure 11:
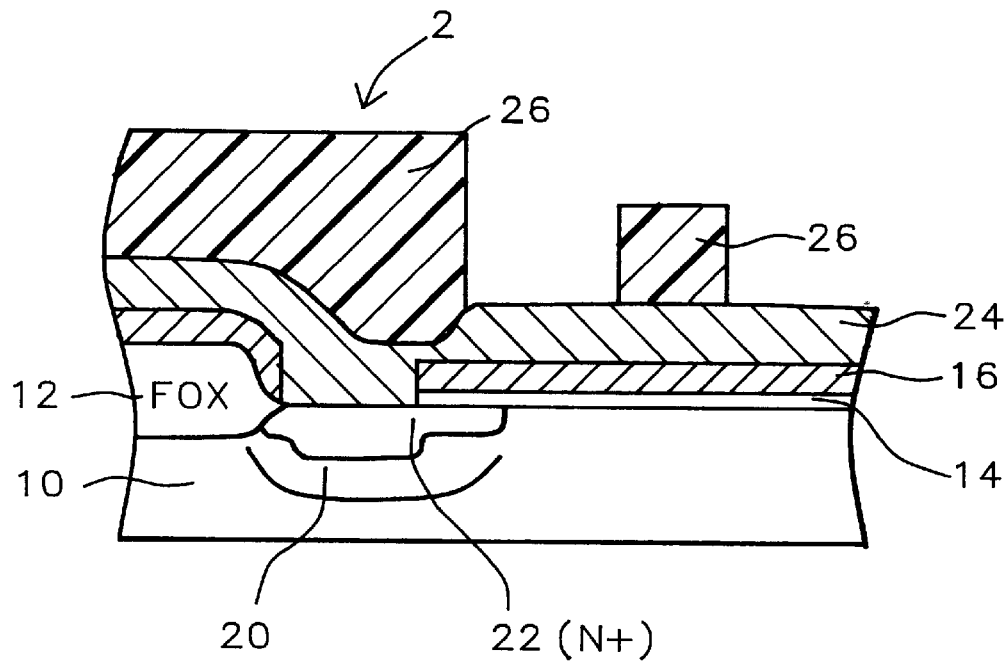

Now as shown in FIG. 11, a second polysilicon layer, which is also $N^+$ doped, and a silicide layer are deposited consecutively to form a polycide layer 24 over the device areas and in the opening 2 to make electrical contact to the $N^+$ diffused region 22 in the substrate. The second polysilicon layer is deposited by LPCVD using a reactant gas such as $SiH_4$ and is doped, for example with phosphorus (P), to a concentration of between about 1.0 E 20 and 1.0 E 21 atoms/cm$^3$. For example, the second polysilicon layer is doped by ion implantation using $p^{31}$, or alternatively can be in-situ doped by adding a dopant gas, such as phosphine ($PH_3$), during the polysilicon deposition. The preferred thickness of the second polysilicon layer is between about 500 and 1500 Angstroms. The silicide layer is preferably a tungsten silicide ($WSi_2$) and is deposited by CVD using tungsten hexafluoride ($WF_6$) and $SiH_4$, and is deposited to a thickness of between about 750 and 1500 Angstroms. A second photoresist mask 26 is deposited by spin coating, and is patterned to define the gate electrodes and the interconnecting polycide lines over the diffused region 22 to form the buried contact for the FET.

Figure 12:
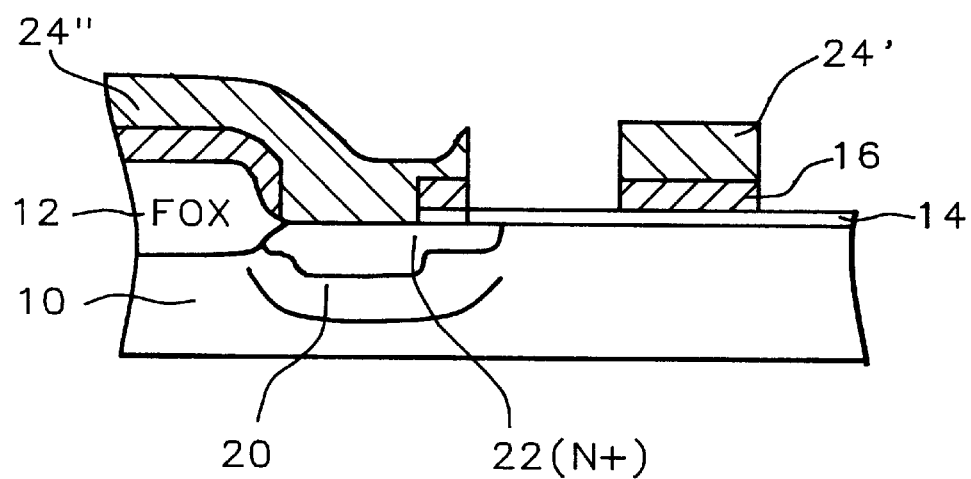

Referring to FIG. 12, the patterned second photoresist mask 26 (FIG. 11) is now used as an etch mask for etching the polycide layer 24 and the first polysilicon layer 16 to form the gate electrode 24' for the FETs in the device areas, and concurrently to form the interconnecting polycide lines 24" to the diffused contact region 22. Preferably the polycide layer 24 is anisotropically plasma etched by reactive ion etching or by using a high-density plasma etcher and an etchant gas such as sulfur hexafluoride ($SF_6$) or $Cl_2$. An overetch having a high etch selectivity of polysilicon-to-silicon oxide is used to etch the first polysilicon layer 16. The preferred etchant gas for layer 16 is $Cl_2$. The extension of the diffused region 22 underneath the gate oxide 14 having a length of d+s, as shown in FIG. 10, provides increased latitude in misalignment of the second photoresist mask 26 without resulting in trenching or electrical opens. This allows more reliable and higher packing density of devices on integrated circuits, such as on SRAMs. The angular implantation also reduces the sheet resistance between the buried contact and the FET when the FET source/drain areas are implanted. The method of this invention is particularly useful for making the contact between the drain of the pass transistor and the gate of the pull-down transistor on the SRAM.

Figure 13:
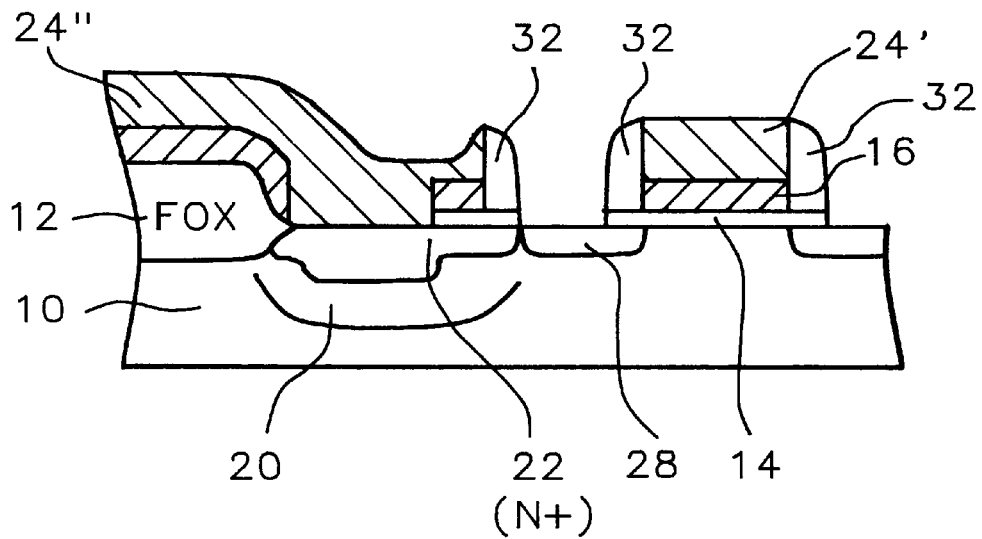

Referring to FIG. 13, lightly $N^+$ doped source/drain areas 28 are implanted adjacent to the gate electrode 24' and into the extended diffused region 22 to provide a low sheet resistance between the buried contact and the FET. Preferably the lightly doped source/drain areas are doped using an implant dose of between about 1.0 E 13 and 1.0 E 14 ions/cm$^2$ using an implant energy of between about 20 and 50 KeV. A sidewall insulating layer is deposited and anisotropically etched back to form sidewall spacers 32 on the sidewalls of the gate electrode 24' and also on the sidewall of the polycide interconnecting line 24". Preferably the sidewall insulating layer is a silicon oxide deposited by LPCVD using tetraethosiloxane (TEOS) and $O_2$ as the reactant gas.

Figure 14:
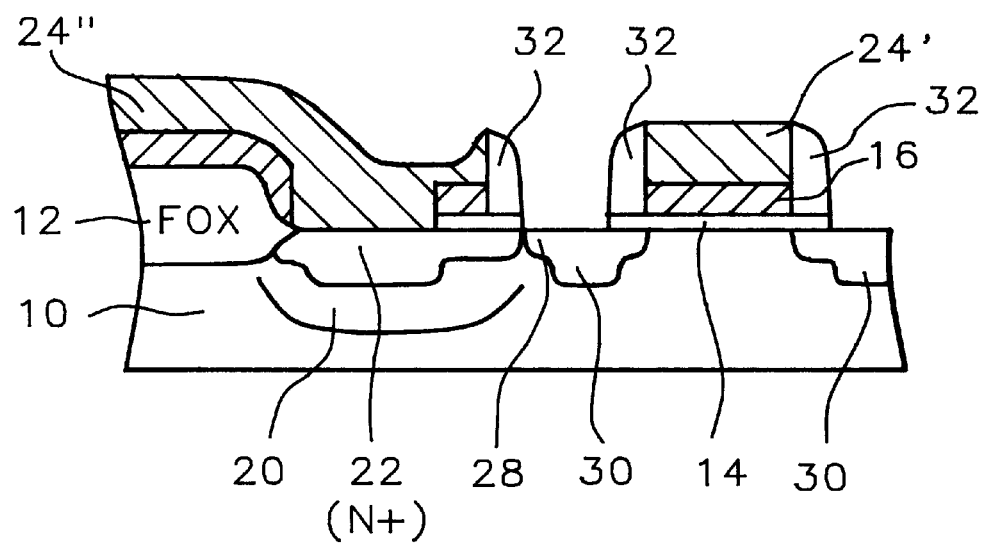

The FET having the buried contact structure is now completed by forming heavily $N^+$ doped FET source/drain contact areas 28, as shown in FIG. 14. Preferably the source/drain contact areas are formed by implanting arsenic or phosphorus ions using an implant dose of between about 2.0 E 15 and 5.0 E 15 ions/cm$^2$ and an implant energy of between about 25 and 60 KeV. This completes the buried contact having the diffused contact region 22 contiguous with the source/drain contact areas 28 resulting in low sheet resistance.

While the invention has been particularly shown and described with reference to the preferred embodiments thereof, it will be understood by those skilled in the art that various changes in form and details may be made without departing from the spirit and scope of the invention. Although the method is applicable for forming buried contacts between the drain of the pass transistor to the gate electrode of the pull-down transistor, it should be understood that the method equally applies to other integrated circuit devices.

What is claimed is:

1. A method for making buried contacts to diffused contact regions for field effect transistors (FETs) on a semiconductor substrate, comprising the steps of:

providing a silicon substrate having device areas surrounded and electrically isolated from each other by field oxide regions;

forming a gate oxide on said devices areas;

depositing a first polysilicon layer on said device areas and on said field oxide regions;

forming openings in said first polysilicon layer and in said gate oxide over said device areas using a patterned first photoresist mask, thereby forming regions for said buried contacts;

isotropically etching said patterned first photoresist mask in said openings thereby recessing said photoresist mask and exposing peripheral portions of said first polysilicon layer along the edge of said openings;

using a first $N^+$ ion implantation and implanting at an angle into said substrate through said openings and said peripheral portions of said first polysilicon layer and said gate oxide and further extending under edge of said photoresist mask thereby forming said diffused contact regions extending further under said gate oxide;

using a second P ion implantation and implanting in said openings extending below said first $N^+$ ion implantation;

depositing consecutively a second polysilicon layer and a silicide layer to form a polycide layer over said device areas and into said openings and on said field oxide regions;

using a patterned second photoresist mask to pattern said polycide layer and said first polysilicon layer to form gate electrodes for said FETs and patterned electrical connections to said diffused contact regions thereby completing said buried contacts.

2. The method of claim 1, wherein said first polysilicon layer is in situ doped $N^+$ and is deposited to a thickness of between about 300 and 1000 Angstroms.

3. The method of claim 1, wherein said first photoresist mask is recessed a distance of between 500 and 2000 Angstroms.

4. The method of claim 1, wherein said first $N^+$ ion implantation is $p^{31}$ and is carried out at an angle of between about 15 and 45 degrees.

5. The method of claim 1, wherein said first N$^+$ ion implantation has an implant dose of between about 1.0 E 15 and 4.0 E 15 atoms/cm$^2$ and at an implant energy of between about 25 and 60 KeV.

6. The method of claim 1, wherein said second P ion implantation is B$^{11}$ and has an implant dose of between about 1.0 E 13 and 7.0 E 13 atoms/cm$^2$ and at an implant energy of between about 60 and 120 KeV.

7. The method of claim 1, wherein said second polysilicon layer is N$^+$ doped to a concentration of between about 1.0 E 20 and 1.0 E 21 atoms/cm$^3$ and said second polysilicon layer is deposited to a thickness of between about 500 and 1500 Angstroms.

8. The method of claim 1, wherein said silicide layer is tungsten silicide having a thickness of between about 750 and 1500 Angstroms.

9. The method of claim 1, wherein said isotropic etching of said patterned first photoresist layer and said first ion implantation at an angle provide a greater latitude in aligning said second polysilicon layer over said openings for said buried contacts.

10. The method of claim 1, wherein said first ion implantation further reduces the sheet resistance between said buried contacts and said FETs.

11. A method for making buried contacts to diffused contact regions that are electrically connected to field effect transistor (FET) source/drain contact areas on a semiconductor substrate, comprising the steps of:

providing a silicon substrate having device areas surrounded and electrically isolated from each other by field oxide regions;

forming a gate oxide on said devices areas;

depositing a first polysilicon layer on said device areas and on said field oxide regions;

forming openings in said first polysilicon layer and in said gate oxide over said device areas using a patterned first photoresist mask, thereby forming regions for said buried contacts;

isotropically etching said patterned first photoresist mask in said openings thereby recessing said photoresist mask and exposing peripheral portions of said first polysilicon layer along the edge of said openings;

performing a first N$^+$ ion implantation and implanting at an angle into said substrate through said openings and said peripheral portions of said first polysilicon layer and said gate oxide and further extending under edge of said photoresist mask thereby forming said diffused contact regions extending further under said gate oxide;

performing a second P ion implantation and implanting in said openings extending below said first N$^+$ ion implantation;

depositing consecutively a second polysilicon layer and a silicide layer to form a polycide layer over said device areas and into said openings and on said field oxide regions;

using a patterned second photoresist mask to pattern said polycide layer and said first polysilicon layer to form gate electrodes for said FETs and patterned electrical connections to said diffused contact regions thereby forming said buried contacts;

forming lightly doped source/drain areas adjacent to said gate electrodes by ion implantation;

depositing a sidewall insulating layer and etching back to form sidewall spacers on said gate electrodes;

implanting said source/drain contact areas contiguous with said diffused contact regions thereby completing said buried contacts for said FETs.

12. The method of claim 11, wherein said first polysilicon layer is in situ doped N$^+$ and is deposited to a thickness of between about 300 and 1000 Angstroms.

13. The method of claim 11, wherein said first photoresist mask is recessed a distance of between 500 and 2000 Angstroms.

14. The method of claim 11, wherein said first N$^+$ ion implantation is p$^{31}$ and is carried out at an angle of between about 15 and 45 degrees.

15. The method of claim 11, wherein said first N$^+$ ion implantation has an implant dose of between about 1.0 E 15 and 4.0 E 15 atoms/cm$^2$ and at an implant energy of between about 25 and 60 KeV.

16. The method of claim 11, wherein said second P ion implantation is B$^{11}$ and has an implant dose of between about 1.0 E 13 and 7.0 E 13 atoms/cm$^2$ and at an implant energy of between about 60 and 120 KeV.

17. The method of claim 11, wherein said second polysilicon layer is N$^+$ doped to a concentration of between about 1.0 E 20 and 1.0 E 21 atoms/cm$^3$ and said second polysilicon layer is deposited to a thickness of between about 500 and 1500 Angstroms.

18. The method of claim 11, wherein said silicide layer is tungsten silicide having a thickness of between about 750 and 1500 Angstroms.

19. The method of claim 11, wherein said isotropic etching of said patterned first photoresist layer and said first ion implantation at an angle provide a greater latitude in aligning said second polysilicon layer over said openings for said buried contacts.

20. The method of claim 11, wherein said first ion implantation further reduces the sheet resistance between said buried contacts and said FETs.

21. The method of claim 11, wherein said lightly doped source/drain areas are implanted with an N$^+$ dopant to a dose of between 1.0 E 13 and 1.0 E 14 atoms/cm$^2$ and at an implant energy of between about 20 and 50 KeV.

22. The method of claim 11, wherein said source/drain contact areas are implanted with an N$^+$ dopant to a dose of between 2.0 E 15 and 5.0 E 15 atoms/cm$^2$ and at an implant energy of between about 25 and 60 KeV.

23. The method of claim 11, wherein said FETs are access transistors on static random access memory (SRAM) cells and said buried contacts form connections between the drains of said FETs and the gates of driver transistors.

* * * * *